United States Patent
Holzrichter et al.

(10) Patent No.: US 6,693,943 B1
(45) Date of Patent: Feb. 17, 2004

(54) PHASED LASER ARRAY FOR GENERATING A POWERFUL LASER BEAM

(75) Inventors: John F. Holzrichter, Berkeley, CA (US); Anthony J. Ruggiero, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/265,461

(22) Filed: Oct. 4, 2002

(51) Int. Cl.$^7$ .......................... H01S 3/091; H01S 3/093
(52) U.S. Cl. .......................................... 372/75; 372/72
(58) Field of Search ........................... 372/75, 99, 72

(56) References Cited

U.S. PATENT DOCUMENTS

| | | | |
|---|---|---|---|
| 3,639,684 A | * | 2/1972 | Levine ................. 348/269 |
| 4,213,704 A | * | 7/1980 | Burns et al. .......... 356/485 |
| 4,757,268 A | | 7/1988 | Abrams et al. |
| 5,033,054 A | | 7/1991 | Scifres et al. |
| 5,088,105 A | | 2/1992 | Scifres et al. |
| 5,319,659 A | | 6/1994 | Hohimer |
| 5,619,522 A | * | 4/1997 | Dube .................. 372/72 |
| 5,627,850 A | * | 5/1997 | Irwin et al. .......... 372/43 |
| 5,920,588 A | | 7/1999 | Watanabe |
| 6,020,990 A | | 2/2000 | Brock |
| 6,052,218 A | | 4/2000 | Chandra et al. |
| 6,385,228 B1 | | 5/2002 | Dane et al. |
| 6,594,299 B1 | * | 7/2003 | Hirano et al. ......... 372/75 |
| 6,621,849 B1 | * | 9/2003 | Thro et al. ........... 372/99 |

FOREIGN PATENT DOCUMENTS

| EP | 0 571 126 A2 | 11/1993 |
|---|---|---|
| EP | 0 774 810 A2 | 5/1997 |

* cited by examiner

*Primary Examiner*—Paul Ip
*Assistant Examiner*—Hung T Vy
(74) *Attorney, Agent, or Firm*—Eddie E. Scott; Alan H. Thompson

(57) ABSTRACT

A first injection laser signal and a first part of a reference laser beam are injected into a first laser element. At least one additional injection laser signal and at least one additional part of a reference laser beam are injected into at least one additional laser element. The first part of a reference laser beam and the at least one additional part of a reference laser beam are amplified and phase conjugated producing a first amplified output laser beam emanating from the first laser element and an additional amplified output laser beam emanating from the at least one additional laser element. The first amplified output laser beam and the additional amplified output laser beam are combined into a powerful laser beam.

42 Claims, 9 Drawing Sheets

PHASED LASER ARRAY FOR GENERATING A POWERFUL LASER BEAM

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of Endeavor

The present invention relates to lasers and more particularly to a phased laser array for generating a powerful laser beam.

2. State of Technology

EP Patent No. 0571126 published Nov. 24, 1993 for an apparatus and method for optical energy amplification using two-beam coupling provides the following information, "a diffraction limited working beam at a given frequency is amplified without degrading its diffraction limited quality by diverting a minor portion of the beam as a probe beam, and amplifying the remaining portion of the working beam with a high power pump beam at a different wavelength."

U.S. Pat. No. 6,385,228 for a coherent beam combiner for a high power laser to C. Brent Dane and Lloyd A. Hackel issued May 7, 2002 provides the following information, "A phase conjugate laser mirror employing Brillouin-enhanced four wave mixing allows multiple independent laser apertures to be phase locked producing an array of diffraction-limited beams with no piston phase errors. The beam combiner has application in laser and optical systems requiring high average power, high pulse energy, and low beam divergence."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system for generating a powerful laser beam. The system includes a first laser element and at least one additional laser element. There may be a few individual laser elements such as the first laser element and the at least one additional laser element or a large number of individual laser elements such as the few thousand individual laser elements illustrated by embodiments of the invention described in the detailed description of the invention. An injection system directs a first injection laser signal into the first laser element and directs an additional injection laser signal into the at least one additional laser element. The injection system produces a re-circulating (i.e., pump) beam within the first laser element and into the at least one additional laser element. An input system directs a first part of the reference laser beam into the first laser element and directs at least one reference laser beam into the first laser element and directs at least one additional part of the reference laser beam into the at least one additional laser element. An amplification and phase conjugation system amplifies and phase conjugates the first part of the reference laser beam and the at least one additional part of the reference laser beam, and produces a first amplified output laser beam emanating from the first laser element and at least one additional amplified output laser beam emanating from the at least one additional laser element. The amplification and phase conjugation system is operatively connected to or operatively integrated into the first laser element and the at least one additional laser element. An angular dispersing element causes the outputs to miss the input system. A combiner system combines all of the amplified laser beams including the first amplified output laser beam and the at least one additional amplified output laser beam into a powerful laser beam.

The system provides a method of generating a powerful and high quality (i.e., highly focusable) laser beam. A first laser element is provided. At least one additional laser element is provided. A first injection laser signal is injected into the first laser element. At least one additional injection laser signal is injected into the at least one additional laser element. This produces a re-circulating (i.e., pump) beam within the first laser element and within the at least one additional laser element. A first part of the reference laser beam is injected into the first laser element. At least one additional part of the reference laser beam is injected into the at least one additional laser element. The first part of the reference laser beam and the at least one additional part of the reference laser beam are amplified and phase conjugated producing a first amplified output laser beam emanating from the first laser element and an additional amplified output laser beam emanating from the at least one additional laser element. The first amplified output laser beam and the additional amplified output laser beam are combined together into the powerful laser beam.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1A:
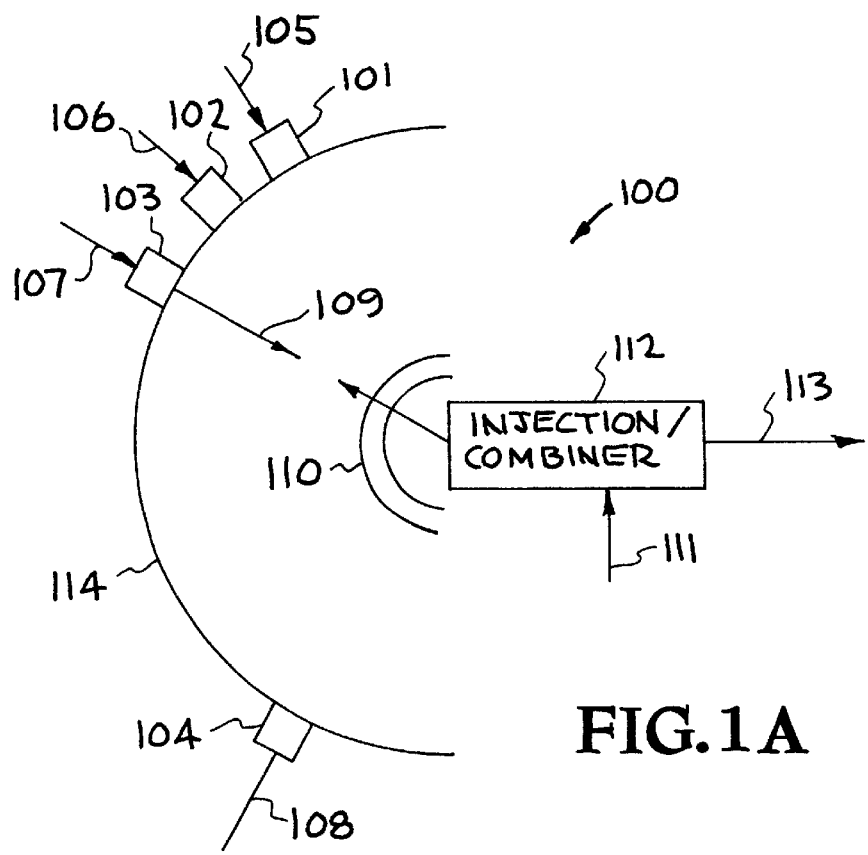
FIG. 1A illustrates a system incorporating the present invention.

Referring now to the drawings, to the following detailed information, and to incorporated materials; a detailed description of the invention, including specific embodiments, is presented. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Referring now to FIG. 1A, an embodiment of a system incorporating the present invention is illustrated. The system is generally designated by the reference numeral 100. The system 100 is constructed in accordance with the present invention and utilizes methods of the present invention. The system 100 comprises laser element system, which includes a first laser element 101 and at least one additional laser element 102. An injection system directs a first injection laser signal 105 into the first laser element 101 and directs an additional injection laser signal 106 into the at least one additional laser element 102. The injection system produces a re-circulating (i.e., pump) beam within the first laser element and within the at least one additional laser element.

An input system 112 directs a first part of the reference laser beam into the first laser element 101 and directs at least one additional part of the reference laser beam into the at least one additional laser element 102. There is one master reference laser beam and parts of the master laser beam enter each of the laser elements in its field of view.

An amplification and phase conjugation system amplifies and phase conjugates the first part of the reference laser beam that enters into the first laser element 101 and the at least one additional part of the reference laser beam that enters into the element 102, and produces a first amplified output laser beam emanating from the first laser element and at least one additional amplified output laser beam emanating from the at least one additional laser element. A combiner system 112 combines the first amplified output laser beam and the at least one additional amplified output laser beam into a powerful laser beam 113.

System 100 illustrates a layout of a multiplicity of laser elements positioned on a reference surface 114. Laser element 1 is identified by the reference numeral 101. Laser element 2 is identified by the reference numeral 102. Laser element 3 is identified by the reference numeral 103. Additional laser elements are provided through laser element n identified by the reference numeral 104. Laser element 1, laser element 2, laser element 3, and laser element n may be various types of laser elements, for example Laser element 1, laser element 2, laser element 3, and laser element n may be diode laser elements. There may be a few individual laser elements such as laser elements 101, 102, 103, and 104, or a large number of individual laser elements, for example, a few thousand individual laser elements as described in connection with following embodiments.

An injection laser signal is operatively connected to laser element 1. The injection laser signal is represented by the reference numeral 105. An injection laser signal is operatively connected to laser element 2. This injection laser signal is represented by the reference numeral 106. An injection laser signal is operatively connected to laser element 3. This injection laser signal is represented by the reference numeral 107. An injection laser signal is operatively connected to laser element "n." This injection laser signal is represented by the reference numeral 108. The injection laser signals 105, 106, 107, and 108 can be produced by any of a number of devices that will provide an injection laser signal; for example, they may be produced by a laser beam from a laser delivered by an optical fiber. The injection laser signals produce recirculating (i.e., pump) beams within the laser elements 101, 102, 103, and 104.

An input reference beam that illuminates all laser elements is identified by the reference numeral 110. As shown in FIG. 1A, the input reference beam 110 is shown being directed into laser element 3; however, it is understood that the input reference beam 110 is directed into all of the laser elements 101, 102, 103, and 104. The input reference beam 110 is produced by an input system 112. An oscillator input beam identified by the reference numeral 111 is directed into input system and combines 112. Input system and combiner 112 produce the input reference beam 110.

As shown in FIG. 1A, laser element 3, reference numeral 103, produces a phase conjugated and amplified output amplified beam 109. It is to be understood that Laser element 1, laser element 2, laser element 3, and laser element n each produce an output amplified beam 109. Each laser element 101, 102, 103, and 104 is locked to a fixed laser frequency by the injection laser signals 105, 106, 107, and 108. Each laser element 10 1, 102, 103, and 104 receives a part of the reference laser beam 110 that enters each of the laser element cavities and the part that enters is phase conjugated and amplified. The amplified output beams 109 have distortions corrected and are increased in intensity. The laser medium of laser elements 101, 102, 103, and 104 enables 4-wave phase conjugation of the injection laser signals 105, 106, 107, and 108. The mix of the injection laser signals 105, 106, 107, and 108 and the reference laser beams 110 effectively produces a phase and amplitude grating within the laser medium and produces the amplified output laser beams 109 emanating from the laser elements 101, 102, 103, and 104. The output laser beams 109 are the phase conjugates of part of the reference laser beam 110 that enters said elements. The output amplified beams 109 are directed into injector and combiner 112. The injector and combiner 112 produces an amplified and phase corrected output beam identified by the reference numeral 113.

The injector and combiner 112 receives the oscillator input beam 111 and produces the input reference beam 110 and also separates the input reference beam 110 from the output amplified beams 109. The output amplified beams 109 have their distortions corrected and are increased in intensity as they return to the injector and combiner 112. The output beams combine together as they approach and enter the injector-combiner element. The injector and combiner 112 may include a Faraday rotator and a polarizer, or a dispersive phase conjugation technique may be used in each laser element to enable the return beam to pass to one side of and not enter the master oscillator element, thus avoiding damage to the master oscillator reference system.

The system 100 illustrates how a multiplicity of diode lasers can be arrayed and phase locked together with a master oscillator and a Faraday rotator-polarizer system to allow the output beam to bypass the oscillator structure. The system 100 illustrates how a multiplicity of laser elements are aligned such that they can receive an input master reference laser beam, which is phase conjugated and reflected back to the central source. The laser elements and amplifiers are polarization preserving.

In one embodiment, each laser element is locked by a laser fiber that enters from one of the sides and each laser has an internal feedback structure that causes the internal circulating wave to be at the same frequency for all laser elements and to sustain a large area spatial mode. The circulating pump laser beams within the diode laser elements can be locked to a frequency identical to the common injected laser wavelength.

The diode laser elements have a circulating internal laser beam (often called a pump laser beam) that is fixed in frequency by the injected wave and the internal feedback structures inside the laser element cavity. To make these individual laser elements work in a system, an incoming master reference oscillator beam is directed toward an array of individual diode laser elements. Part of the master reference wave enters each laser element where-upon it is "4-wave" phase conjugated in each diode laser element, and is amplified and returned and collected into a high power laser beam, at the wavelength defined by the phase conjugation process and direction. The laser element is polarization preserving.

A variation is that the wave can be phase conjugated and returned at a slightly different wavelength and direction, if desired. This occurs when "non-degenerate" 4-wave phase-conjugation is employed as the phase conjugation process. In addition, the system 100 shown in FIG. 1A illustrates how the diodes can be arrayed on a curved surface 114, similar to a mirror; it is not necessary that they be so arranged. The reference surface can be a flat surface rather than the curved surface 114 shown in FIG. 1A. There are many other arrangements of diodes on reference sur faces that can have beneficial qualities such as enhancing heat removal from the diode structures, or minimizing cross sectional dimensions, and others. These are made possible by employing laser element structures that enable diodes to be phase-conjugated (modulo $2\pi$), as long as the distance from the oscillator/input system of said laser elements is within the "coherence-length" of the reference laser beam.

The system 100, in connection with the laser elements 101, 102, 103, and 104, uses a master phase reference laser beam which illuminates the output apertures of each one of the multiplicity of representative individual active lasers, laser elements 101, 102, 103, and 104. This master phase reference laser is noted as MPRL herein. The MPRL beam impinges upon the output apertures of all of the individual laser elements, thereby illuminating laser elements 101, 102, 103, and 104. The individual lasers are called ILEs for Individual Laser Elements, and there may be a few of them or a few thousand such ILEs in an example phase-conjugate mirror system.

Part of the MPRL beam is transmitted into each individual laser element cavity by entering through the partially transmitting output mirror. This output mirror might (as an example) have a reflectivity of 80%, at the wavelength of, or at the direction of, the MPRL beam, meaning 20% of the MPRL beam (that strikes the aperture of each element) enters the cavity, and is amplified by the laser medium. This MPRL beam is then reflected by the interference pattern set up between the internal circulating (i.e., pump) laser beam inside of each ILE and the incoming MPRL beam.

Because of the physics of the reflection process, known to experts in the field as 4-wave Phase Conjugation, when the injection laser beams and the reference laser beam are at the same frequency as the incoming MPRL is reflected directly back in the direction that it came from. Furthermore, it returns with a conjugate phase which enables the return beam to retrace its incoming path precisely in both direction and with a special inverse phase. By conjugated phase it is meant that when the beam returns to its origin (the MPRL output aperture), its phase will be identical to the phase it had when it started, except that it will be traveling in the reverse direction. This causes the many sources of phase-distorting aberrations within the laser elements, within the "fill lenses," and in the air paths to be corrected.

This phase inverting process enables the part of the incoming MPRL beam, that enters one of the ILEs, to return to the original aperture of MPRL with all optical distortions corrected. By extension, the return beams from all of the ILEs return to the original aperture of the MPRL, mimicking the output reference beam, but traveling in the "converging direction" leading to a collective beam of very good phase quality, strongly enhanced in amplitude (by the amplification process that took place inside each of the ILEs total returning output beam). All of the individual returning beams join together to form a uniform, smooth phase and amplitude, output beam 113 of the System 100.

High power laser beams have many applications ranging from metal cutting, to cinema projection, to energy transmission, and to directed-energy military weapons.

Presently, individual semiconductor diode lasers are manufactured in many configurations, such as the well known GaAs hetro-junction laser. These have many advantages for the above mentioned applications, except for the fact that they generate relatively little power, typically 0.1 watts. When increased in size to generate higher power levels, such as 1 to 10 Watts from one laser structure, the output beam becomes multi-moded and is not good for focusing. If two or more low power laser diodes, of the above mentioned example of 0.1 Watt GaAs diode lasers, are placed close to each other, such that their output beams point in the same direction, the combined laser beam will be multi-mode in character. The combined laser beam, when focused by a large collecting lens to a small spot, will appear as two separate spots at the focus (corresponding to each individual laser beam).

In one embodiment the system include a non-linear element operatively connected within the first laser element and additional laser elements. In another embodiment the frequency of the reference laser wave is different than the injected laser wave. This condition leads to "non-degenerate" 4-wave phase-conjugation. In this case, the output laser element beams travel in a different direction than the input part of the reference laser beam if angular dispersing elements are present. This causes them to miss the input system. In another embodiment, fill lenses are used to prevent power loss and to increase the spatial coherence of the output laser beam. fill lenses are used to prevent power loss and to increase the spatial coherence of the output laser beam.

Figure 1B:
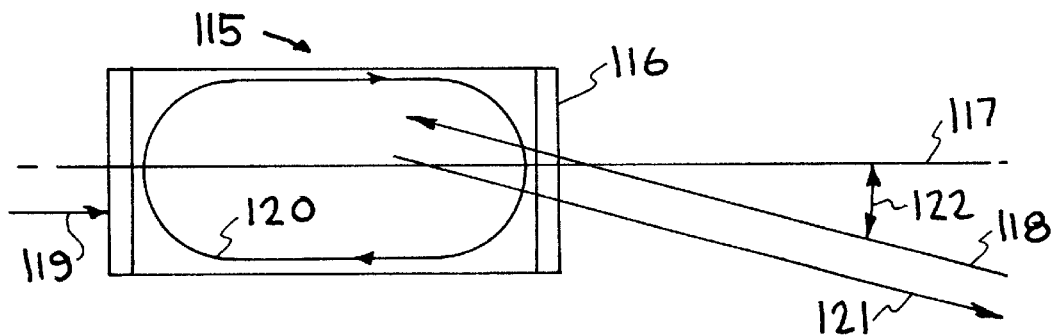
FIG. 1B illustrates another embodiment of a system laser element incorporating the present invention.

Referring now to FIG. 1B, another embodiment of a system incorporating the present invention is illustrated. The system 100 described above utilizes laser elements wherein the part of the input reference beam 118 and the amplified output laser beam 121 enter and exit from the laser elements, from the end of the laser elements. In the embodiment illustrated by FIG. 1B, the amplified output laser beams also exit from the laser elements from the ends of the laser elements and at an angle θ 122 to the central axis 117 of the laser elements. One of the laser elements 115 of the additional embodiment of the invention is shown in FIG. 1B.

An injection laser signal 119 enters laser element 115. The laser beam in the laser element 115 is locked to the fixed laser frequency of the injection laser signal 119, which grows in intensity and circulates as a pump laser wave within the laser element 115 as illustrated by the circulating laser pump beam 120. Part of an input reference beam 118 is directed into to the laser element 115 from the end of the laser element. The input part of the reference beam 118 is usually not aligned with the central axis 117 of the laser element 115. By adjusting the angle of the incoming reference beam 118, and the degree of angular transmission vs frequency in the output mirror element 116, the amplified output beam 121 is generated at the angle θ 122. Beam 121 is phase conjugated and amplified. The amplified output beam 121 has distortions corrected and is increased in intensity. The mix of the pump laser signal and the part of the reference laser beam 118 in the laser medium effectively produces a phase and amplitude grating, which produces the amplified output laser beam 121 emanating from the laser element 115 at the same direction as the output laser beam.

Figure 1C:
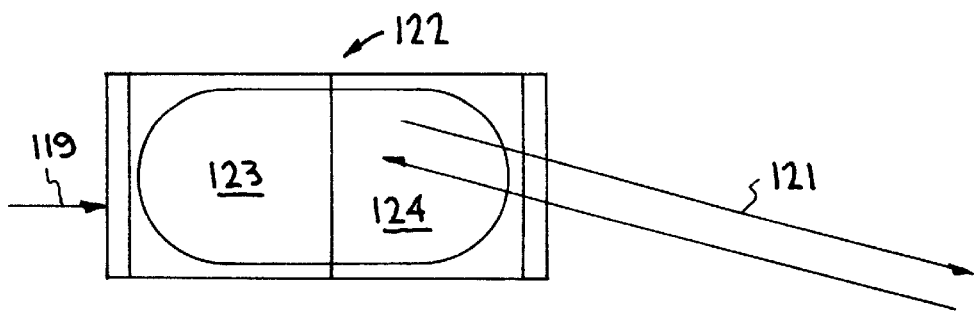
FIG. 1C illustrates another embodiment of a system laser element incorporating the present invention.

Referring now to FIG. 1C, another embodiment of a system incorporating the present invention is illustrated. In the system 100 of FIG. 1A, the mix of the pump laser signal and the part of the reference laser beam effectively produces a phase and amplitude grating within the laser material which produces the amplified output laser beams emanating from each laser element. The output laser beams are the phase conjugate of the part of the reference laser beam. The laser elements have a single laser material containing the circulating internal laser beam that is fixed in frequency by the injected wave and the internal feedback structures inside the laser element cavity.

In the embodiment illustrated by FIG. 1C, the laser element 122 has two different optical materials 123 and 124. The two different optical materials 123 and 124 are a laser material and non-linear phase-conjugation material. The laser material 123 receives the injection laser light injection signal, which circulates within the laser element 122 cavity in the laser material 123 and in the phase-conjugation material. The laser medium 123 and the separate phase conjugation material 124 enables 4-wave phase conjugation of the injection laser signal in the laser element. A mix of the injection laser signal 119 and the part of the reference laser beam occurs in the separate phase-conjugation material 124 and produces the phase-conjugated amplified output laser beam 121 emanating from the laser element 122.

Figure 1D:
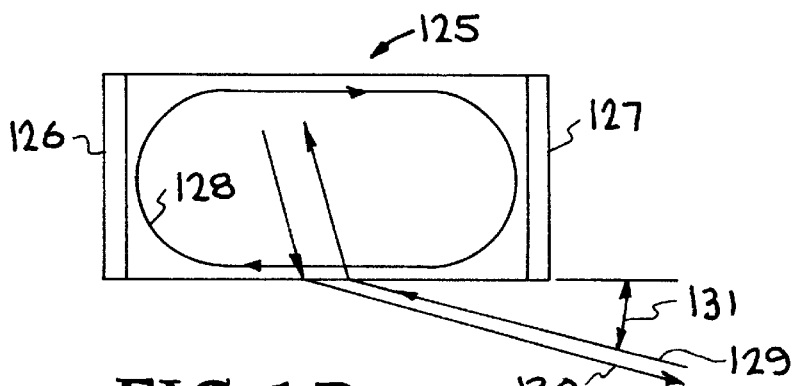
FIG. 1D illustrates another embodiment of a system laser element incorporating the present invention.

Referring now to FIG. 1D, another embodiment of a system incorporating the present invention is illustrated. The system 100 described above in FIG. 1A utilizes laser elements wherein the input reference beams and the amplified output laser beams enter and exit from the laser elements from the end of the laser elements mis-aligned with the central axis of the laser elements. One of the laser elements 125 of the additional embodiment of the invention is shown in FIG. 1D. In the embodiment illustrated by FIG. 1D, the part of the input reference beam 129 enters the side of the laser element and the amplified output laser beam 130 exits from the same side of laser element 125 at an angle similar to that of the input part of the reference wave.

An injection laser signal enters laser element 125. The laser element 125 is locked to a fixed laser frequency by the injection laser signal, which causes a pump beam to grow in amplitude and to circulate within the laser element 125 as illustrated by the circulating beam 128 between mirrors 126 and 127. A part of the input reference beam 129 is directed into the laser element 125 from the side of the laser element. The input angle θ 131 is usually nearly 90°. The amplified output beam 130 exits from the side of the laser element 125 and is phase conjugated and amplified. The amplified output beam 130 has distortions corrected and is increased in intensity. The laser medium of laser element 125 enables 4-wave phase conjugation of the injection laser signal 129 (even at 90° to the pump direction). The mix of the circulating pump laser signal 128 and the part of the reference laser beam effectively produces a phase and amplitude grating and produces the amplified output laser beam 130 emanating from the laser element 125.

Figure 1E:
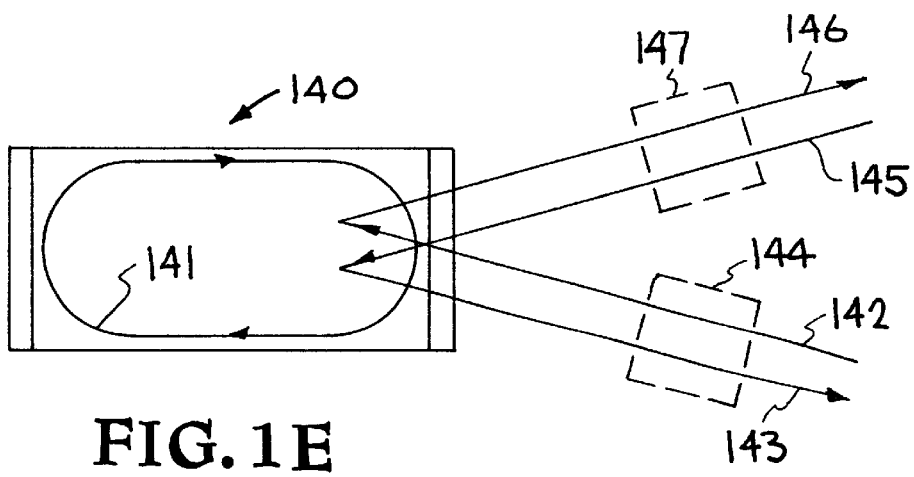
FIG. 1E illustrates another embodiment of a system laser element constructed in accordance with the present invention.

Referring now to FIG. 1E, another embodiment of a system laser element constructed in accordance with the present invention is illustrated. In the system 100 of FIG. 1, the mix of the pump laser signals and the part of the reference laser beams effectively produces a phase and amplitude gratings within the laser materials which produces the amplified output laser beams emanating from each of the laser elements. The laser elements have a laser material containing the circulating internal laser beam that is fixed in frequency by the injected wave and the internal feedback structures inside the laser element cavity. For some applications, the input reference laser beams and the output laser beams may need to be intensified. This is accomplished by adding a laser amplifier 144 as illustrated in FIG. 1E.

In the embodiment illustrated by FIG. 1E, an injection laser signal enters laser element 140 as described in the previous figures and descriptions. It is understood that laser element 140 represents the laser elements of a system the same as or similar to the system 100 shown in FIG. 1. The laser beam in the laser element 140 is locked to the fixed laser frequency of the injection laser signal, which grows in intensity and circulates as a pump laser wave within the laser element 140. This is illustrated by the circulating laser pump beam 141 within the laser element 140. An input reference beam 142 is directed into to the laser element 140 at the end of the laser element 140. The input reference beam 142 is usually not aligned with the central axis of the laser element 140. The mix of the pump laser beam 141 and the reference laser beam 142 produces a phase and amplitude grating within the laser material which produces an amplified output laser beam 143 emanating from the laser element 140. The output laser beam 143 is the phase conjugate of the reference laser beam 142. The amplified output beam 143 has distortions corrected and is increased in intensity. The input reference laser beam 142 and the output laser beam 143 are intensified by the laser amplifier 144. It is understood that laser amplifiers may be included with some or all of the laser elements in the system 100. There may be two or more parts of the reference wave (see 145), being amplified if necessary by two or more laser amplifiers (see 147), phase conjugated by one laser element, and two or more output waves (see 146), amplified in the output path. The material of the laser element 140 and the amplifiers 144 and 147 may be the same material or they may be different materials. The laser amplifier and phase conjugating laser element in some embodiments are of two different materials such that the laser linewidths of the two materials are sufficiently broad to sustain 1 nanometer or larger laser-spectral-line offsets relative to each other, and that the laser material spectral line centroids are sufficiently close that they the amplifier increases the intensity of the outgoing wave of the laser element as desired.

Figure 2:
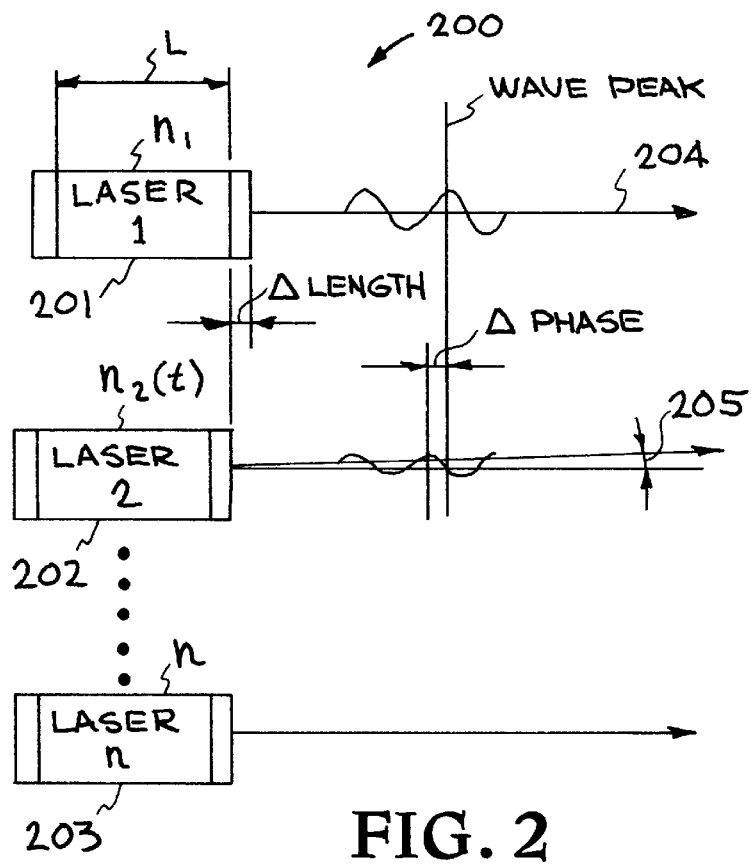
FIG. 2 is an illustration of beam output from individual laser elements.

Referring now to FIG. 2, an illustration of laser beam output from the individual laser elements is shown. The system shown in FIG. 2 is generally designated by the reference numeral 200. The system 200 is an illustration of n lasers (also referred to as laser elements), each with differing output phase, amplitude, and direction of laser beam emission. Laser 1 is identified by the reference numeral 201. Laser 2 is identified by the reference numeral 202. Additional lasers are contemplated through laser n identified by the reference numeral 203. The laser beam output and direction is indicated by reference numeral 204. The a theta direction of the output laser beam is indicated by the reference numeral 205. Attempts to phase together large numbers of individual lasers has been overwhelmed by the problems of measuring the optical phase of each individual diode laser (relative to a master phase from a master laser oscillator). Then the processors laser phase, amplitude, and direction must calculate the proper correcting information in a very short time period (less than 10 nsec), and then send the correction signal to the correction element in each individual laser to cause it to correct the phase, direction, and amplitude of its output beam.

Figure 3:
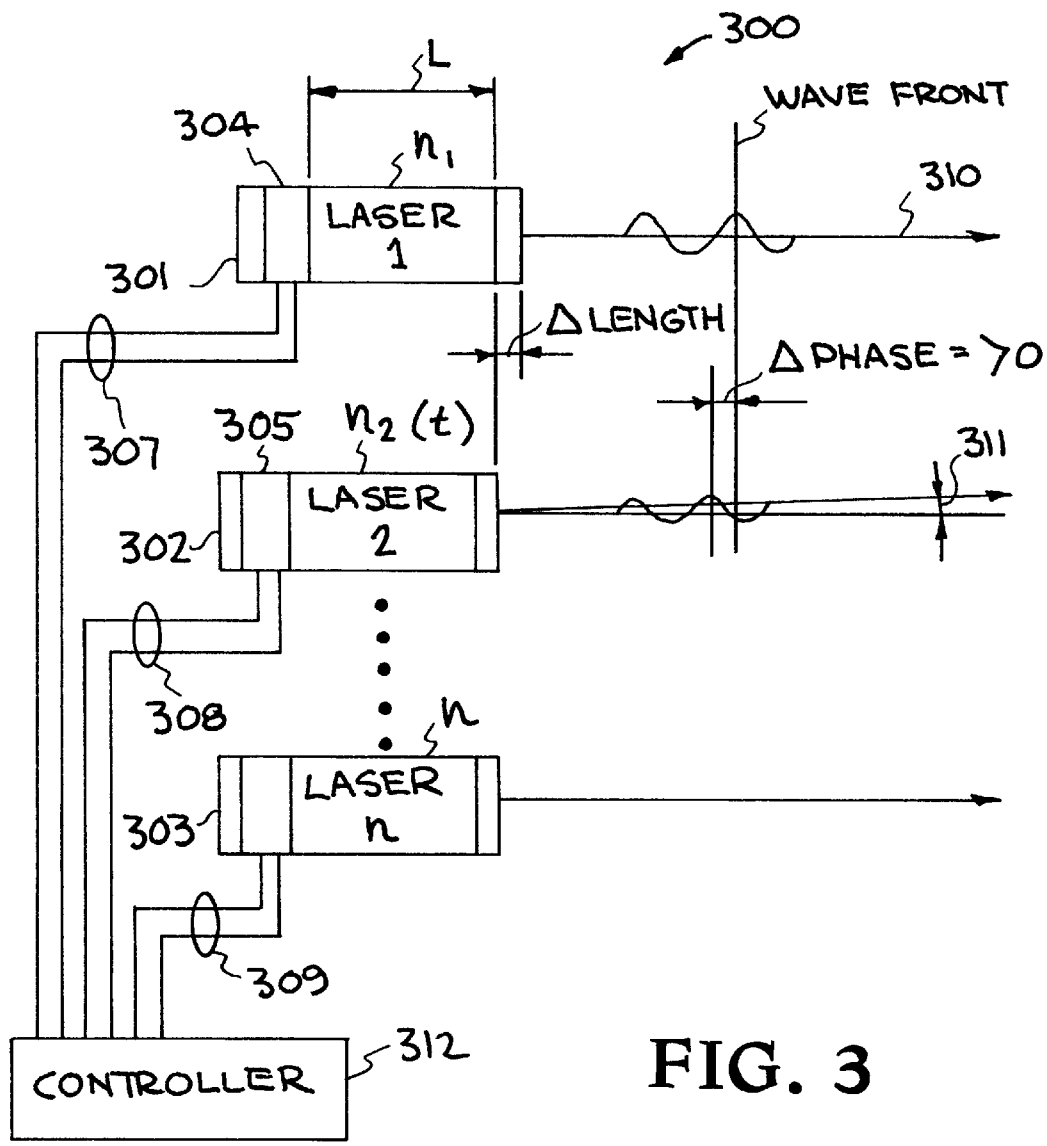
FIG. 3 is an illustration of laser element beam phase correction.

Referring now to FIG. 3, an illustration of prior art laser element beam correction is shown. The system shown in FIG. 3 is generally designated by the reference numeral 300. Laser 1 is identified by the reference numeral 301. The beam corrector (including phase, direction, and amplitude) corrector element 1 is identified by the reference numeral 304. Control wires for laser correction element 1 are identified by the reference numeral 307. Laser 2 is identified by the reference numeral 302. The laser beam corrector element 2 is identified by the reference numeral 305. Control wires for laser correction element 2 are identified by the reference numeral 308. Additional lasers are contemplated through laser n identified by the reference numeral 303. Beam corrector element n is identified by the reference numeral 306. Control wires for laser beam correction element n are identified by the reference numeral 309. The laser beam output and direction is indicated by reference numeral 310. The δ theta direction, which also requires correction, is indicated by the reference numeral 311.

A prior art method of correcting many laser units to a common phase and direction is illustrated in FIG. 3. Small electro-optic phase shifting devices, 304, 305, and 306, are attached to each diode laser (which are typically millimeters or smaller in dimension). However their correction sensors and feedback loops 312 take too long to measure and correct the phase to a master phase to the controller unit 312 and they cost too much. Representative control wires from each corrector element, 304, 305, and 306 are shown. It is noted that sensors and controllers that are needed to do this are very expensive and take too long to make the needed phase direction correction, and amplitude before the laser medium experiences a phase direction, and/or amplitude change. Other systems use a master phase conjugation device which measures and corrects the phase of thousands of devices at the same time.

Figure 4:
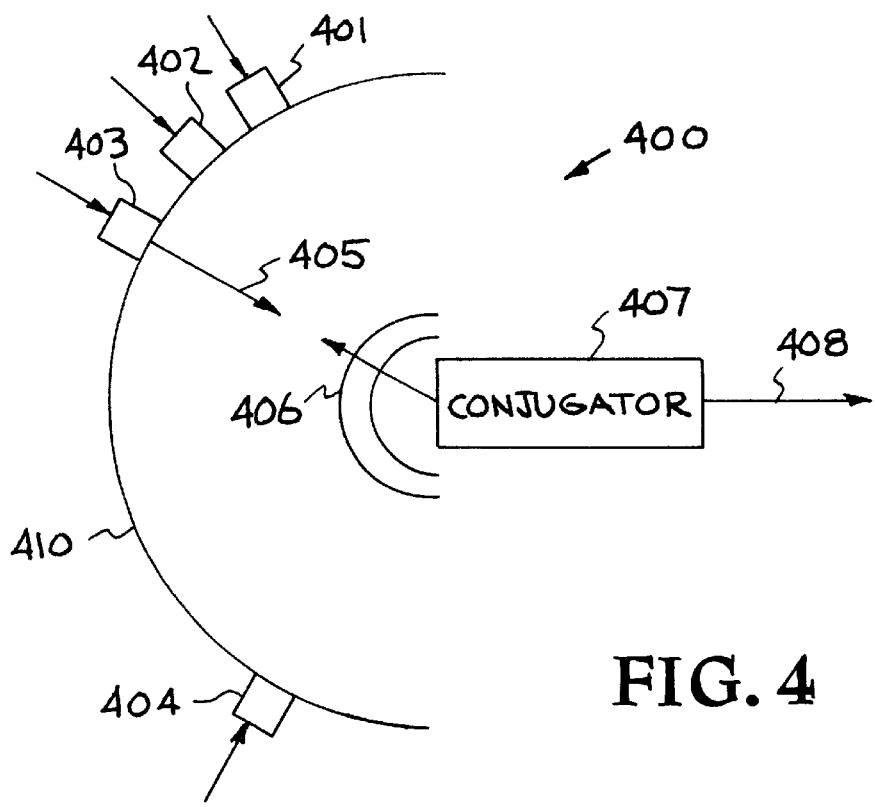
FIG. 4 illustrates beam combining.

FIG. 4 illustrates a prior art array of laser elements of the type shown in FIG. 3, which attempt to use a central phase-conjugating correcting element, to adjust the output phase and direction of each laser element. The system shown in FIG. 4 is generally designated by the reference numeral 400. Laser 1 is identified by the reference numeral 401. Laser 2 is identified by the reference numeral 402. Laser 3 is identified by the reference numeral 403. Additional lasers are contemplated through laser n identified by the reference numeral 404. The laser elements use a central (i.e., master) phase-conjugator corrector to correct all of the waves from each laser element. In practice this does not work especially with diode lasers because the system is too unreliable, and the time to do the phase correction is too long.

Two major problems have occurred in these prior art systems. The system took too much time to determine and correct the phase of each diode laser , thus by the time the phase error was sensed and was being corrected, the diode laser under correction had already become further distorted, so the correction didn't arrive in time to work. Secondly, the collective return beam commonly converged onto the beam injector and the master oscillator system (especially in phased conjugated architectures) and destroyed the oscillator device because of excessive power loading. The only devices that have been built using these prior art systems were small in size having only a few laser elements, and thus were low in output power, and they were extremely expensive. They did not meet the needs of the commercial or military communities which desire to use diode laser systems at increasingly high power levels and affordable cost.

In response to such concerns, applicants developed a method and system that economically and rapidly measures and corrects the phase of a large number of individual laser elements so that their combined beams fuse together to become a powerful, focusable laser beam for many desired applications. Herein, systems and methods describe implementation of arrays of laser diodes, or other small lasers, such that the combined laser output beams of said arrays are in phase and can be focused as if the combined be am behaved as if it were a single-mode laser beam. Systems and methods are described that enable the combining the beams from many sub laser units into a substantially coherent, single-mode laser beam of high power, high energy, and high focusability (i.e., high coherence). Using the techniques described herein, small sub laser units, especially semiconductor lasers, can be combined using methods and systems herein, such that they produce a laser beam that simulates the output of a much larger laser.

Recently, distributed feedback diode lasers have been constructed that produce an internal laser mode pattern that has a single, large diameter transverse mode (e.g., at least 0.1 mm diameter), a narrow linewidth, (e.g., 1 MHz), and are able to be locked to a single input frequency. Applicants have developed a phase conjugated laser system based upon such laser elements. The availability of these diodes and the phase conjugation demonstrations using a single diode laser, enable the user, by applying the concepts described herein, to cause many discrete diode lasers to be phase-locked together to form a collective, phase coherent output beam. The spatial structure of the collective beam reflects that of the initial reference laser beam and it's temporal structure is substantially monochromatic having a uni-phase wavefront, caused by locking together the output beam phases from each diode, modulo 2 pi.

The system may use a master laser oscillator source of input (i.e., injected) coherent light, parts of which are received by each diode laser, and whose purpose is to lock each of the internal laser beams of each oscillator to a common wavelength. Each laser element then phase-conjugates and amplifies part of the beam from a second oscillator, called the input reference oscillator beam, and re-radiates it, phase conjugated (modulo 2 pi), with respect to part of the incoming reference beam, without the need for a central phase conjugator nor for the need of electro-optic phase shifters on each diode laser structure. The output beams, from each of the diode lasers, travel back in the direction of the incoming oscillator beam, making a collective beam with vastly increased power and coherence.

Figure 5:
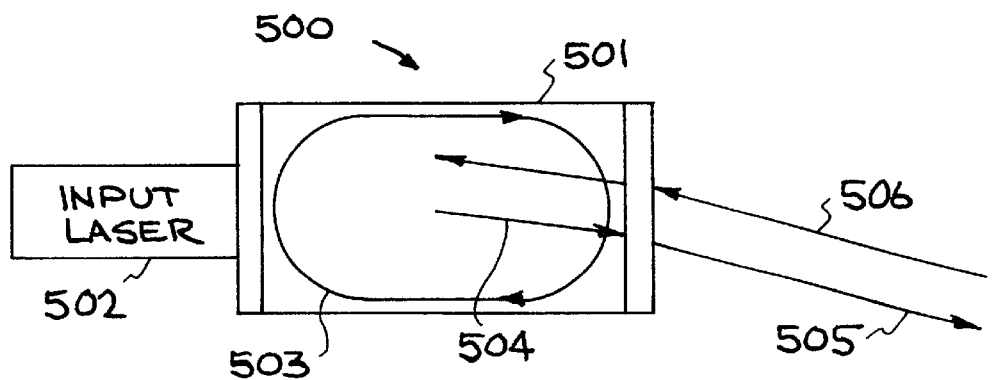
FIG. 5 illustrates a colinear phase conjugating laser element.

Referring now to FIG. 5, an illustration showing an individual phase conjugated laser element with internal circulating wave, and external input and output wave is provided. The circulating wave (i.e., pump) inside each individual laser is locked to master oscillator injection beam brought in by fiber. The collective output beam from the diode arrays can be shifted in wavelength from the incoming part of the reference master oscillator, by means of a "non-degenerate 4-wave phase conjugating" process. This process occurs when non-identical frequency injector signals and input reference laser signals are employed. This important aspect of this part of the invention (See FIG. 6) is that it prevents damage to the master oscillator or to the output beam oscillator by causing the collective output beam to shift in angle, due to angular dispersion of the output beam as it passes through an angular dispersion. This causes the output beam to pass around the oscillator systems electro-optical components, and be collected by an output optical system that forms a high power beam.

FIG. 5 shows a system 500 including a number of elements. A typical laser element 501 that phase-conjugates an external reference wave input beam, then amplifies it within the laser medium, and finally it generates a phase-conjugate output wave propagating backward toward the incoming reference beam. Laser Element 501 also serves as a phase conjugator by means of 4-wave mixing in the laser material. The laser element 501 includes partially reflecting end mirrors, and injection fiber. An injection laser beam via fiber optic is identified by the reference numeral 502. A circulating internal pump laser wave, locked to the injection wave from the fiber optic is identified by the reference numeral 503. A phase-conjugated and amplified wave traveling in the backward (i.e., return) direction is identified by the reference numeral 504. An external reference wave input is identified by the reference numeral 506.

The system 500 uses an output mirror and other internal devices, e.g., phase or amplitude gratings, that are almost 100% reflecting to maintain the laser action of the internal circulating pump laser wave. For parts of the reference wave coming in at an angle to the laser axis, from the external direction, the output mirror allows good transmission (for example greater than 50%), allowing the reference wave to enter into the cavity. Inside the cavity, the reference wave reflects from a spatial pattern of amplitude and/or phase variations, set up by the interaction of the input reference wave and the circulating internal pump-laser wave. This special reflection process, called 4-wave, phase-conjugation, reverses both the phase and the direction of the reference beam, into an output beam. The output beam is conjugated and amplified as it leaves the laser element cavity, and follows exactly the path back to the central mirror structure of the incoming reference wave, being corrected in phase such that when it arrives at the central corrector element it is in phase with respect to the reference beam except that it is propagating in the opposite direction. If the injected oscillator beam and the part of the reference beam are equal in frequency the output beam follows the return path perfectly, but if the injected and reference beam are purposefully different in frequency, the output beam can be made to follow a difference return direction.

Figure 6:
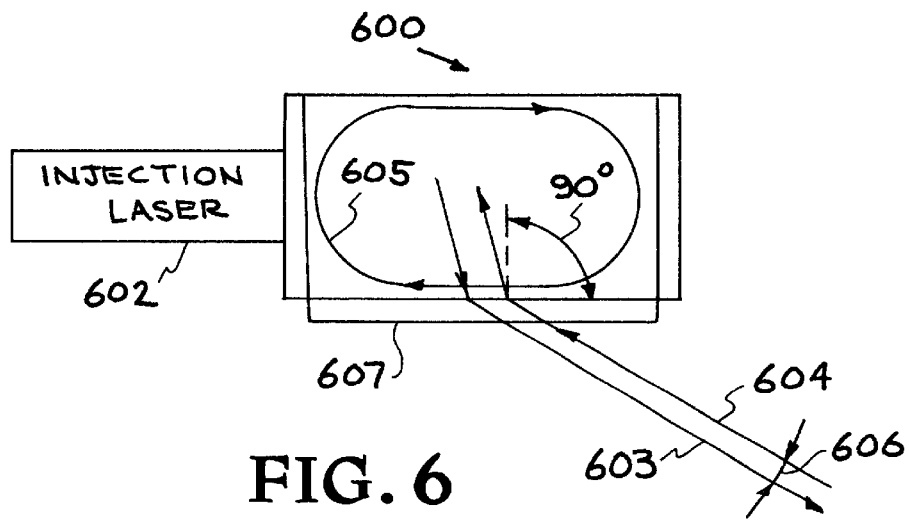
FIG. 6 illustrates a "near" 90 degree phase conjugating laser element.

Referring now to FIG. 6, the orthogonal laser element geometry is illustrated. A number of elements are included in system 600. A laser element with reflecting end mirrors, and an injection fiber is identified by the reference numeral 601. An injection laser beam via a fiber optic is identified by the reference numeral 602. A circulating internal laser pump wave, locked to the frequency of the injection wave from the fiber-optic is identified by the reference numeral 605. An output wave, which is phase conjugated, is identified by the reference numeral 603. An external reference wave input is identified by the reference numeral 604.

The system 600 has the advantage of separating the directions of the reference beam and the internal circulating beams. A laser structure wherein the internal circulating wave is fixed in frequency by the injection laser and by internal feedback structures of the laser element, and is contained between the laser mirrors. However, the external reference wave from the system master oscillator (at a different frequency than that of the internal pump beam) is brought in from the side of the laser, whereupon a phase conjugated output wave is generated, that returns to the master oscillator. A directional change θ 606 as the external wave enters and then leaves the laser element material as an output wave, is due to dispersion in the refraction at the surface as the wave enters and leaves the high index of refraction laser medium or by using an angular dispersing element 607. The angle of the reference and out wave can be near normal (i.e., at 90°) to the laser element axis, if desired or it can be at another angle.

The methods of phase conjugation, used herein, have been demonstrated in the past for single laser elements. However, it has not been possible in prior art to make a successful operating system of many elements that work reliably together. Prior systems are not low enough in cost to use a large number of laser elements, nor is the phase correction fast enough, and they are not able to join together the workings of 2 to >2000 laser elements to create a highly focusable output beam. The arrangement of phase conjugating elements within the individual laser cavities and the laser element arrangements in the system described herein provide a powerful laser beam. The specially designed laser elements having a large laser-mode area (i.e., sometimes called a multimode cavity), have feedback elements within the cavity to produce a single-phase pump beam. The system has a reference oscillator, a central beam injector and output beam separator, and an injection system bringing reference laser light into each laser element, and other items that accomplish the objectives of the described system.

Figure 7:
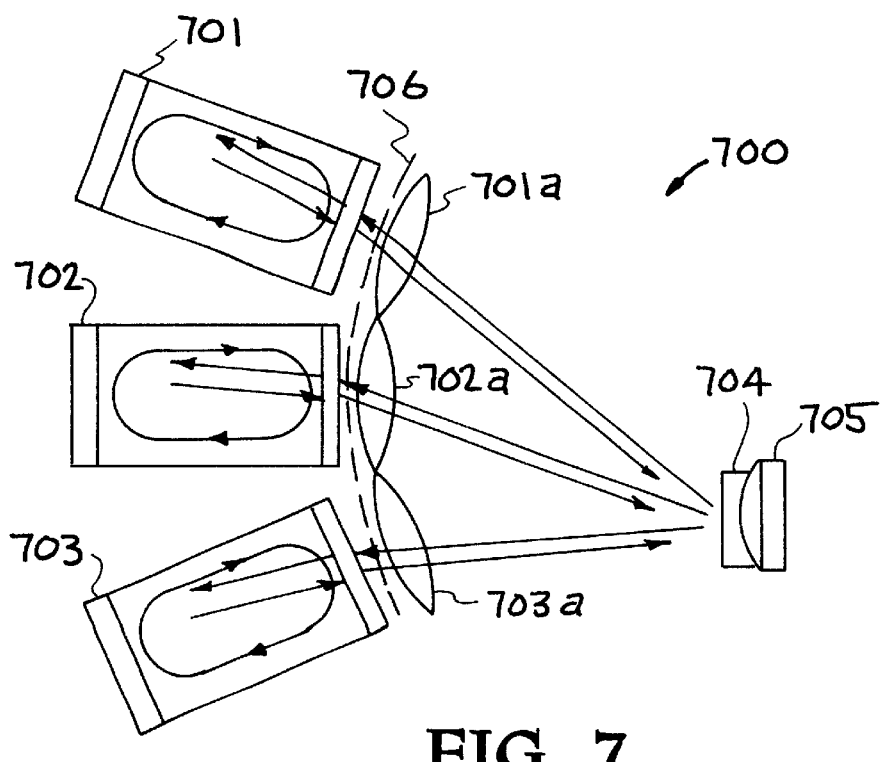
FIG. 7 illustrates a system of 3 laser elements with fill lenses.

FIG. 7 shows a system 700. Laser elements 701, 702, 703, etc. are shown. Lenses 701A, 702A, 703A, etc. are provided. One of the problems in such systems is that the active laser area is a small fraction of the area of each laser element facing the central reference beam director. By placing a lens such as 701A in front of each laser element that covers the entire area of each laser element, and all of the energy of each part of the reference beam is directed into the laser cavity, the efficiency of the system is increased dramatically. In addition, the focusability of the collected output beams is increased dramatically.

Figure 8:
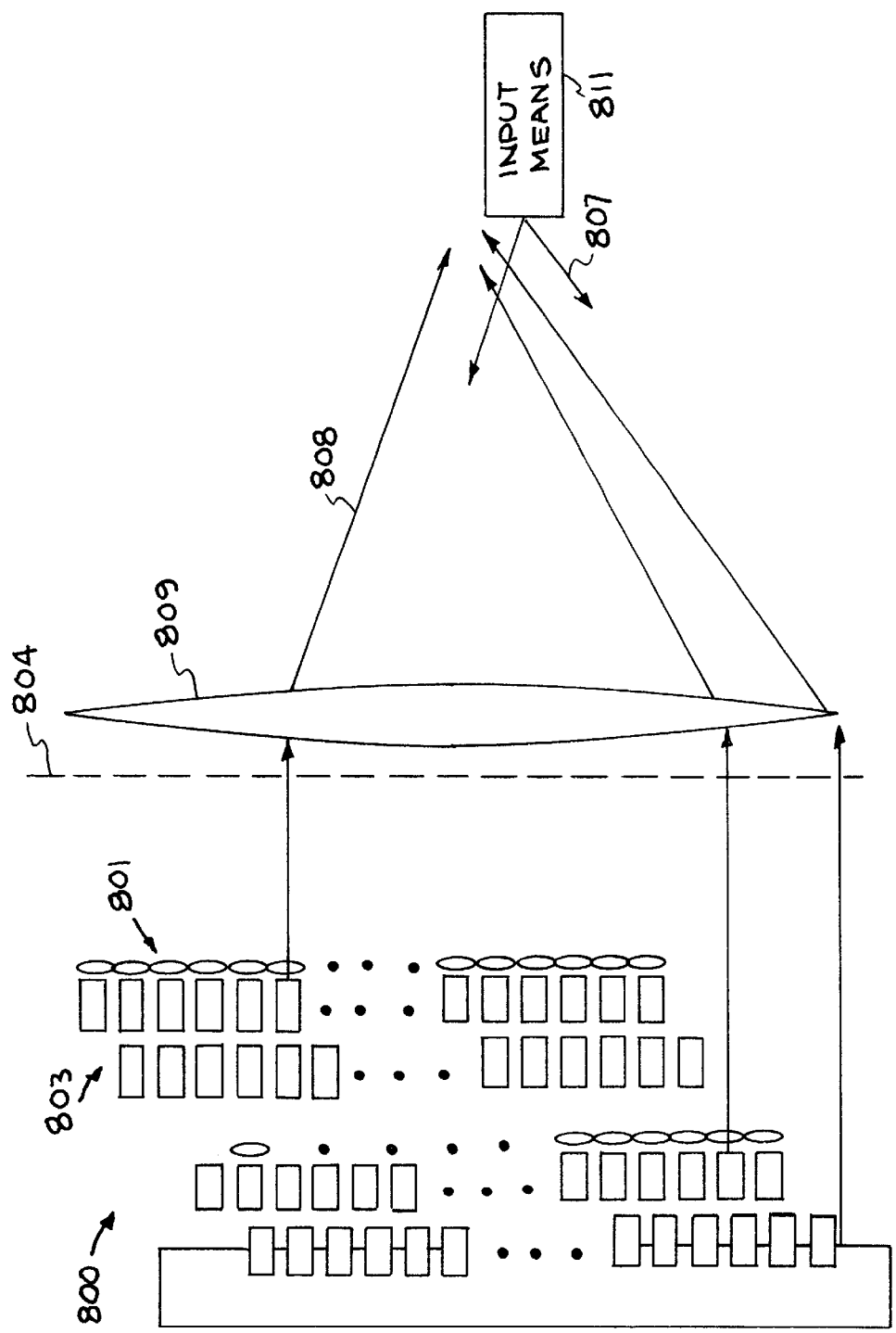
FIG. 8 illustrates a system using a Fill-Lens.
Figure 11:
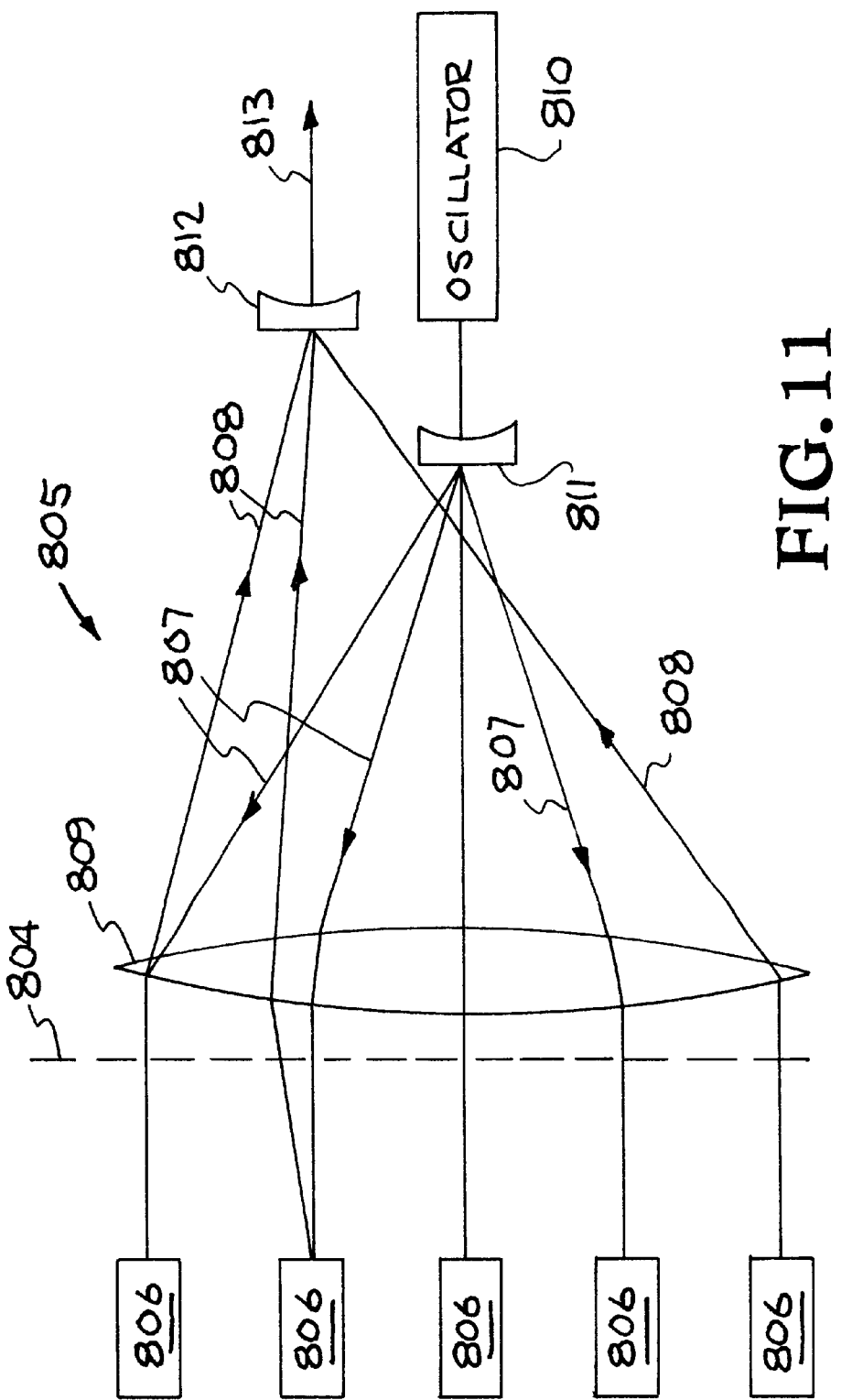
FIG. 11 illustrates another embodiment of a system using a disperser element.

FIG. 8 shows a system 800 using a large collection lens. (A focusing mirror can be used also). Fill optics 701, 801 are provided according to systems previously described. A large collecting lens or mirror 802 is positioned in front of the fill optics 801, 701. It collects and directs all of the reference beam to the fill optics, 701, which then directs part of the reference beam energy into each laser cavity 803. Then the fill optics, 701, 801 send all of the output energy to the collection optic, 809 which collects the output waves, whereby the efficiency of the system is increased dramatically. FIG. 11 shows dispersing elements such as a transmission grating 804 can be used to cause the output beams 808 to miss the input system 811 for the reference waves input. In addition the focusability is increased dramatically.

Figure 9:
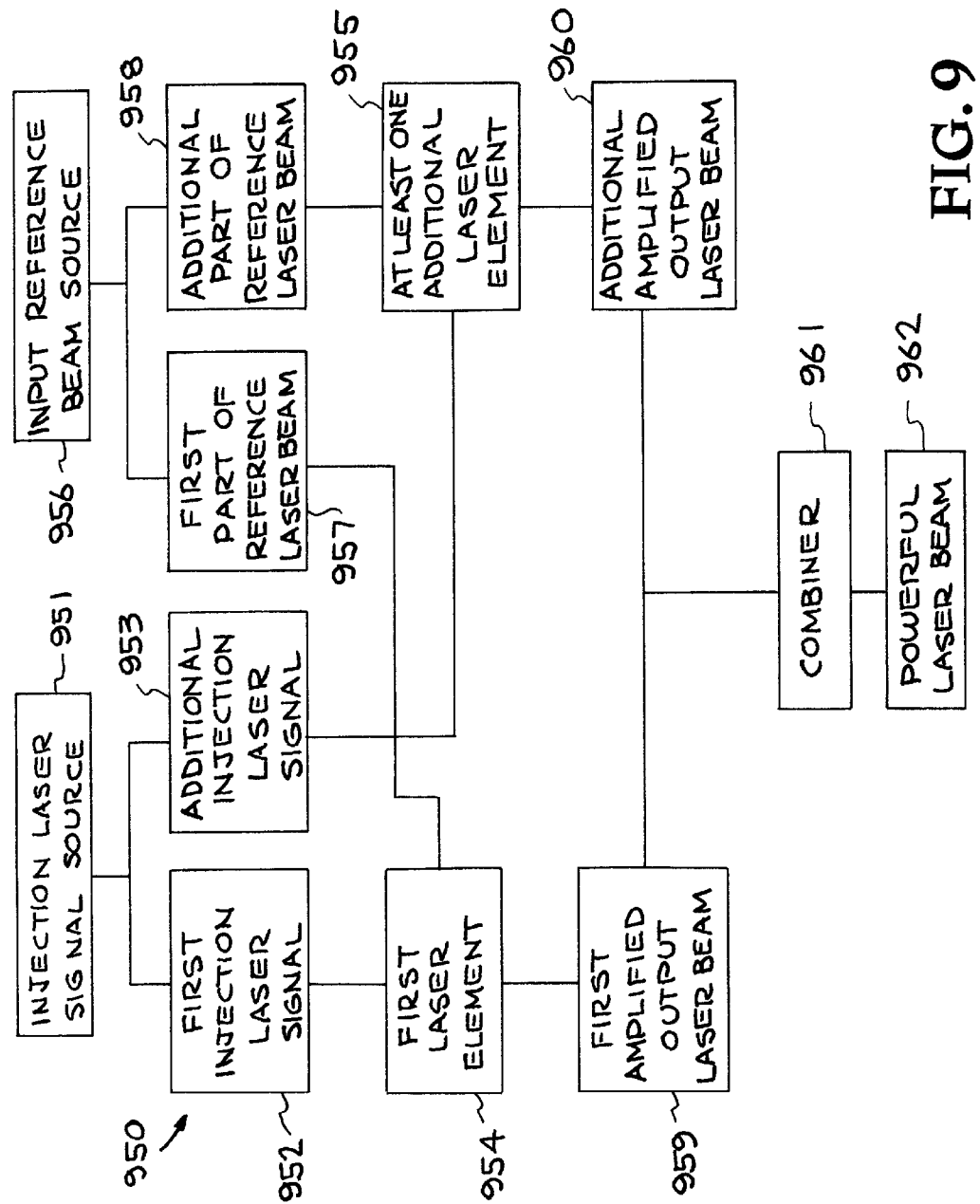
FIG. 9 is a flow diagram illustrating another embodiment of a system constructed in accordance with the present invention.

Referring now to FIG. 9, another embodiment of a system constructed in accordance with the present invention is illustrated by a flow diagram. The system is generally designated by the reference numeral 950. The system 950 is constructed in accordance with the present invention and utilizes methods of the present invention. The system 950 generates a powerful laser beam 962.

An injection laser signal source 951 produces a first injection laser signal 952 and at least one additional laser signal 955. The first injection laser signal 952 and the at least one additional laser signal 955 may be produced by an individual laser or by other system.

The first injection laser signal 952 is introduced into a first laser element 954 causing a first circulating pump laser. The at least one additional injection laser signal 953 is introduced into at least one additional laser element 955 causing an additional circulating pump laser beam. The individual laser elements, first laser element 954 and at least one additional laser element 955, are called ILEs for Individual Laser Elements. There may be a few of them or a few thousand such ILEs.

An input reference beam source 956 produces a first part of a reference laser beam 957 and at least one additional part of a reference laser beam 958. The first reference laser beam 957 and the at least one additional part of a reference laser beam 958 may be produced by an oscillator input reference beam device. For example, the first part of a reference laser beam 957 and the at least one additional part of a reference laser beam 958 may be produced by an oscillator and injector and combiner as shown in FIG. 1A.

Amplification and phase conjugation system that the laser elements amplify and phase conjugate a part of the first reference laser beam and the at least one additional part of the reference laser beam. The amplification and phase conjugation system is operatively connected to or operatively integrated into the first laser element and the at least one additional laser element. The laser medium of laser elements 954 and 955 produces circulating pump waves in the first laser element and the at least one additional laser element from the injection laser signals 952 and 953. The mix of the circulating pump waves and the reference laser beams 957 and 958 effectively produces a phase and amplitude grating and produces the amplified output laser beams 959 and 960 emanating from the laser elements 954 and 955. The output laser beams 959 and 960 are the phase conjugate of the reference laser beams 957 and 958. The laser element system, the injection system, the circulating pump waves, the input system, and the amplification and phase conjugation system produce a first amplified output laser beam emanating from the first laser element and at least one additional amplified output laser beam emanating from the at least one additional laser element.

The first amplified output laser beam 959 emanating from the first laser element 954 and the at least one additional amplified output laser beam 960 emanating from the at least one additional laser element 955 are directed into combiner 961. The combiner system 961 collects and combines said the first amplified output laser beam 956 and the at least one additional amplified output laser beam 960 into the powerful laser beam 962.

There may be a few individual laser elements such as first laser element 954 and at least one additional laser element 955 or a large number of individual laser elements such as the few thousand individual laser elements described above. Each laser element is locked to one fixed laser frequency by the injection laser signals 952 and 953. Each laser element 954 and 955 then receives a part of the reference laser beams 957 and 958 that enters each of the laser element cavities and is phase conjugated and amplified. The amplified output beams 959 and 960 have distortions corrected and are increased in intensity. The laser medium of laser elements 954 and 955 enables 4-wave phase conjugation of the reference laser beams 957 and 958. The mix of the circulating pump waves and the reference laser beams 957 and 958 effectively produces a phase and amplitude grating and produces the amplified output laser beams 959 and 960 emanating from the laser elements 954 and 955. The output laser beams 959 and 960 are the phase conjugate of the inputted parts of reference laser beams 957 and 958. The combiner 961 combines the output laser beams 959 and 960 into the powerful laser beam 962.

Referring again to FIG. 9, methods of the present invention will now be described. Injection laser signals 952 and 953 enter the ILE cavity and produce circulating pump laser beams. Then the part of the reference laser beams 957 and 958 are injected into laser elements 954 and 955 respectively and "mix" with the circulating pump laser beams. This produces the first amplified output laser beam 959 and the additional amplified output laser beam 960. The first amplified output laser beam 959 and the additional amplified output laser beam 960 are combined to produce powerful laser beam 962.

The injection laser signal source 951 produces the first injection laser signal 952 and the at least one additional laser signal 953. The first injection laser signal 952 is introduced into the first laser element 954. The at least one additional laser signal 953 is introduced into the at least one additional laser element 955. The injection laser signals produce re-circulating "pump" laser beams inside the respective laser elements 954 and 955.

The part of the input reference beam source 956 produces the first input reference laser beam 957 and the at least one additional part of the reference laser beam 958. The first reference laser beam 957 part is introduced into the first laser element 954. The at least one additional reference laser beam part 958 is introduced into the at least one additional laser element 955.

The first reference laser beam part 957 and the at least one additional reference laser beam part 958 are amplified and phase conjugated producing a first amplified output laser beam 959 emanating from the first laser element 954 and an additional amplified output laser beam 960 emanating from the at least one additional laser element 955. The laser medium of laser elements 954 and 955 enables 4-wave phase conjugation of the input parts of the reference beam with the injection laser signals 952 and 953. The mixing of the amplified re-circulating laser beams from the injection laser signals 952 and 953, and the part of reference laser beams 957 and 958, produce a phase and amplitude grating and produce the amplified output laser beams 959 and 960 emanating from the laser elements 954 and 955. The output laser beams 959 and 960 are the phase conjugate of the part of reference laser beams 957 and 958.

The first amplified output laser beam 959 emanating from the first laser element 954 and the at least one additional amplified output laser beam 960 emanating from the at least one additional laser element 955 are directed into combiner 961. The combiner 961 combines the first amplified output laser beam 959 and the at least one additional amplified output laser beam 960 into the powerful laser beam 962.

Systems and methods have been described that enable the user to cause many discrete laser units to be phase-locked together such their combined output beams are coherently phased together into a collective output beam. The systems use one or more master laser oscillator sources of coherent light, which are received by each sub laser unit. Each sub laser unit then amplifies the received oscillator beam or beams. The output beam is re-radiated, in phase conjugation (within modulo 2 pi) relative to an incoming beam. The systems do this without using a central phase conjugator for the output beam. It also does this without using electro-optic phase shifters on each diode. The collective output, with vastly increased power and coherence, is diverted in angle by dispersion elements and does not damage the master oscillators.

Systems and methods have been described illustrating how individual sub laser units can be made to both amplify light and phase correct light in a compact and economical manner. Examples of specific laser elements that both amplify and phase conjugate an incoming laser beam are shown. Such lasers can be arrayed into a system with many such sub laser units, or a variety of reference surfaces, each of which is excited by a common master oscillator and each of which corrects for all distortions in the beam path to and from said sub laser units. This method of use of specially designed sub laser units enables the sub laser units to both phase conjugate a system wave and simultaneously amplify the system wave, causing a very intense system laser beam to be produced.

Figure 10:
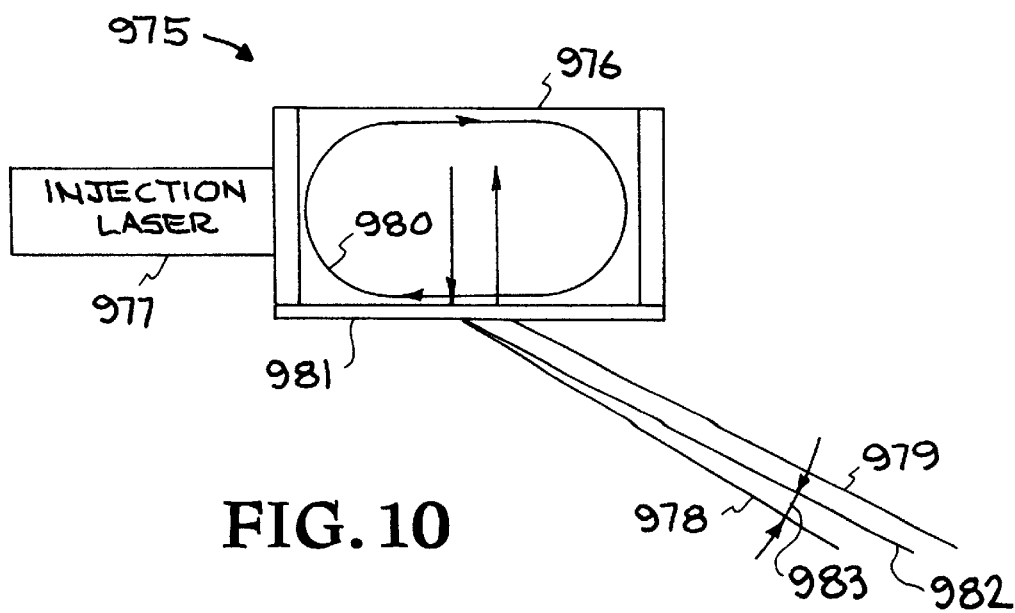
FIG. 10 illustrates another embodiment of a system constructed in accordance with the present invention.

Referring now to FIG. 10, another embodiment of a system constructed in accordance with the present invention is illustrated. The system is generally designated by the reference numeral 975. A number of elements are included in system 975. A laser element 981 with partially reflecting end mirrors, and an injection fiber is shown. A disperser 981 (or grating element 981) is positioned on the side of the laser element 976 or at the fill lens location (706), or at the collecting optic (804). An injection laser beam via fiber optic is identified by the reference numeral 977 which injects the internal laser wave with frequency $\lambda_1$. A circulating internal laser pump wave, locked to injection wave from the fiber-optic, at frequency $\lambda_1$, is identified by the reference numeral 980. An external reference input wave is identified by the reference numeral 979. An output wave, which is phase conjugated, is identified by the reference numeral 978.

Referring now to FIG. 11, another embodiment of a system using a large collection lens is illustrated. The system is designated generally by the reference numeral 805. The system 805 is similar to the system 800 illustrated in FIG. 8. In the system 805 shown in FIG. 11, a multiplicity of laser elements 806 as previously described receive input beams 807 and produce output beams 808. The input beams 807 are produced by an oscillator 810 and an input system 811. A large collecting lens 809 is positioned between the beam combiner 811 and the multiplicity of laser elements 806. A dispersing element 804 causes frequency shifted output beams to miss the reference input system 811.

The input reference beams 807 enter laser elements 806 and mix with pump laser beams inside of laser elements 806 as previously described. Amplified output laser beams 809 are produce emanating from the laser elements 806. The output laser beams 809 are collected by collector 812 and a powerful laser beam 813 is produced. The large collecting lens 809 is positioned between the multiplicity of laser elements 806 and the collector 812. The output of the system 805 is angularly directed (using non-degenerate 4-wave phase conjugation and an angular disperser) as previously described. The output laser beams 808 "miss" the input system 811 and are collected 812.

The system 975 (see FIG. 10) has the advantage of separating the directions of the reference input wave 979 and the output wave 978 by the angle θ. The external reference input wave 979 with frequency $\lambda_1-\Delta$, is brought in from the side of the laser through grating 981. The phase conjugated output wave 978 is generated and returns through the angular dispersion element 981 mounted on the side of the system at frequency $\lambda_1+\Delta$. The grating 981 is a dispersive element that deflects the return path of the output wave 978 relative to the path of the reference input wave 979 by an angle θ 983.

The reference input wave 979 has a frequency $\lambda_1-\Delta$. The output wave 978 has a frequency $\lambda_2$, e equaling frequency $\lambda_1+\Delta$. $\Delta$ is a small frequency shift of about 1–5 nm. The mix of the circulating internal laser pump wave 980 and the reference input wave 979 produces a phase and amplitude grating and produces the output wave 978 at frequency $\lambda_1+\Delta$. The return path of the output wave 978 is deflected relative to the path of the reference input wave 979 by angular dispersion elements such as transmission gratings (981, 706, ad 804). This is illustrated by the output wave being at an angle "θ" from line 982 which represents the path of the reference input wave 979. The output wave 978 is the (non-degenerate) phase conjugate of the reference input wave 979. The output wave 978 has a frequency $\lambda_2=\lambda_1+\Delta$.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system for generating a powerful laser beam, comprising:

laser element means comprising a first laser element and a second laser element;

initiating means for directing a first injection laser signal into said first laser element producing a first circulating laser beam, and for directing a second injection laser signal into said second laser element producing a second circulating laser beam;

input means for directing a first part of a reference laser beam into said first laser element to mix with said first circulating laser beam, and for directing a second part of a reference laser beam into said second laser element to mix with said second circulating laser beam;

amplification and phase conjugation means for amplifying and phase conjugating said first part of a reference laser beam to produce a first amplified output laser beam from said first laser element, and a second amplified output laser beam from said at least one additional laser element, and combiner means for combining said first amplified output laser beam and said second amplified output laser beam into said powerful laser beam.

2. The system for generating a powerful laser beam of claim 1, wherein said first laser element and said second laser element are diode laser elements.

3. The system for generating a powerful laser beam of claim 1, wherein said laser element means includes a third laser element, said initiating means directs a third injection laser signal into said third laser element producing a third circulating laser beam, said input means directs a third part of a reference laser beam into said third laser element to mix with said third circulating laser beam, said amplification and phase conjugation means amplifies and phase conjugates said third part of a reference laser beam to produce a third amplified output laser beam from said third laser element, and said combiner means combines said first amplified output laser beam, said second amplified output laser beam, and said third amplified output laser beam into said powerful laser beam.

4. The system for generating a powerful laser beam of claim 1, wherein said laser element means includes additional laser elements, said initiating means directs additional injection laser signals into said additional laser elements producing additional circulating laser beams, said input means directs additional parts of reference laser beams into said additional laser elements to mix with said additional circulating laser beams, said amplification and phase conjugation means amplifies and phase conjugates said additional parts of reference laser beams to produce additional amplified output laser beams from said additional laser elements, and said combiner means combines said first amplified output laser beam, said second amplified output laser beam, and said additional amplified output laser beams into said powerful laser beam.

5. The system for generating a powerful laser beam of claim 4, wherein said additional laser elements, said additional injection laser signals, said additional circulating laser beams, said additional parts of reference laser beams, and said additional amplified output laser beams comprise five additional laser elements, five additional injection laser signals, five additional circulating laser beams, five additional reference laser beams, and five additional amplified output laser beams, and wherein said combiner means combines said first amplified output laser beam, said second amplified output laser beam, and five additional amplified output laser beams into said powerful laser beam.

6. The system for generating a powerful laser beam of claim 4, wherein said additional laser elements, said additional injection laser signals, said additional circulating laser beams, said additional parts of reference laser beams, and said additional amplified output laser beams comprise ten additional laser elements, ten additional injection laser signals, ten additional circulating laser beams, ten additional reference laser beams, and ten additional amplified output laser beams, and wherein said combiner means combines said first amplified output laser beam, said second amplified output laser beam, and ten additional amplified output laser beams into said powerful laser beam.

7. The system for generating a powerful laser beam of claim 4, wherein said additional laser elements, said additional injection laser signals, said additional circulating laser beams, said additional reference laser beams, and said additional amplified output laser beams comprise twenty additional laser elements, twenty additional injection laser signals, twenty additional circulating laser beams, twenty additional parts of reference laser beams, and twenty additional amplified output laser beams, and wherein said combiner means combines said first amplified output laser beam, said second amplified output laser beam, and twenty additional amplified output laser beams into said powerful laser beam.

8. The system for generating a powerful laser beam of claim 4, wherein said additional laser elements, said additional injection laser signals, said additional circulating laser beams, said additional parts of reference laser beams, and said additional amplified output laser beams comprise fifty additional laser elements, fifty additional injection laser signals, fifty additional circulating laser beams, fifty additional reference laser beams, and fifty additional amplified output laser beams, and wherein said combiner means combines said first amplified output laser beam, said second amplified output laser beam, and fifty additional amplified output laser beams into said powerful laser beam.

9. The system for generating a powerful laser beam of claim 4, wherein said additional laser elements, said additional injection laser signals, said additional circulating laser beams, said additional reference laser beams, and said additional amplified output laser beams comprise one hundred additional laser elements, one hundred additional injection laser signals, one hundred additional circulating laser beams, one hundred additional parts of reference laser beams, and one hundred additional amplified output laser beams, and wherein said combiner means combines said first amplified output laser beam, said second amplified output laser beam, and one hundred additional amplified output laser beams into said powerful laser beam.

10. The system for generating a powerful laser beam of claim 4, wherein said additional laser elements, said additional injection laser signals, said additional circulating laser beams, said additional reference laser beams, and said additional amplified output laser beams comprise five hundred additional laser elements, five hundred additional injection laser signals, five hundred additional circulating laser beams, five hundred additional parts of reference laser beams, and five hundred additional amplified output laser beams, and wherein said combiner means combines said first amplified output laser beam, said second amplified output laser beam, and five hundred additional amplified output laser beams into said powerful laser beam.

11. The system for generating a powerful laser beam of claim 4, wherein said additional laser elements, said additional injection laser signals, said additional circulating laser beams, said additional reference laser beams, and said additional amplified output laser beams comprise one thousand additional laser elements, one thousand additional injection laser signals, one thousand additional circulating laser beams, one thousand additional reference laser beams, and one thousand additional amplified output laser beams, and wherein said combiner means combines said first amplified output laser beam, said second amplified output laser beam, and one thousand additional amplified output laser beams into said powerful laser beam.

12. The system for generating a powerful laser beam of claim 1, wherein said amplification and phase conjugation means includes two materials, a lasing material and a phase conjugating material.

13. The system for generating a powerful laser beam of claim 1, wherein said first laser element and said second laser element have sides, and wherein said first reference laser beam and said second reference laser beam enter said first laser element and said second laser element from said sides.

14. The system for generating a powerful laser beam of claim 13, wherein said first amplified output laser beam and said second amplified output laser beam exit said first laser element and said second laser element from said sides.

15. The system for generating a powerful laser beam of claim 14, including angular dispersive elements in the path of the output laser beam that deflect said first amplified output laser beam and said second amplified output laser beam such that they combine v into a powerful laser beam that v misses the input means.

16. The system for generating a powerful laser beam of claim 1, including fill lenses to prevent power loss and to increase the spatial coherence of said first amplified output laser beam and said at least one additional amplified output laser beam.

17. The system for generating a powerful laser beam of claim 1, including amplifier means for amplifying at least one of said first part of a reference laser beam or said first amplified output laser beam.

18. The system for generating a powerful laser beam of claim 17, wherein said amplifier means comprises a first material and said laser element means comprises a second material.

19. The system for generating a powerful laser beam of claim 18, wherein said first material and said second material are the same materials.

20. The system for generating a powerful laser beam of claim 18, wherein said first material and said second material are different materials.

21. The system for generating a powerful laser beam of claim 18, wherein said first material and said second material are different materials and each have laser linewidths such that the said laser linewidths of the two materials are sufficiently broad to sustain one nanometer or larger laser-spectral-line offsets relative to each other.

22. The system for generating a powerful laser beam of claim 21, wherein said additional laser elements, said additional injection laser signals, said additional circulating laser beams, said additional parts of reference laser beams, and said additional amplified output laser beams comprise more than ten additional laser elements, more than ten additional injection laser signals, more than ten additional circulating laser beams, more than ten additional reference laser beams, and more than ten additional amplified output laser beams, and wherein said combiner combines said first amplified output laser beam, said second amplified output laser beam, and more than ten additional amplified output laser beams into said powerful laser beam.

23. The system for generating a powerful laser beam of claim 18, wherein said first material and said second material are different materials and each have spectral line centroids and the laser material are sufficiently close that they the amplifier increases the intensity of the outgoing wave of the laser element as desired.

24. The system for generating a powerful laser beam of claim 1, wherein said input means for first part of a reference laser beam is offset from said first amplified output laser beam so that said first amplified output laser beam misses said input means for said first part of a reference laser beam.

25. A system for generating a powerful laser beam, comprising:
 a laser element array including a first laser element and at least one additional laser element;
 an injector for directing a first injection laser signal into said first laser element and for directing at least one additional injection laser signal into said at least one additional laser element;
 said laser element array transforming said first injection laser signal and said at least one additional injection laser signal into a first circulating laser beam in said first laser element and at least one additional circulating laser beam in said at least one additional laser element;
 a reference laser beam source for directing a first part of a reference laser beam into said first laser element to mix with said first circulating laser beam and for directing at least one additional part of a reference laser beam into said at least one additional laser element to mix with said at least one additional circulating laser beam;
 an amplifier and phase conjugater for amplifying and phase conjugating said first part of a reference laser beam and said at least one additional part of a reference laser beam and producing a first amplified output laser beam emanating from said first laser element and at least one additional amplified output laser beam emanating from said at least one additional laser element; and
 a combiner for combining said first amplified output laser beam and said at least one additional amplified output laser beam into said powerful laser beam.

26. The system for generating a powerful laser beam of claim 25, wherein said first laser element and said at least one additional laser element are diode laser elements.

27. The system for generating a powerful laser beam of claim 25, wherein said laser element array includes additional laser elements, said injector directs additional injection laser signals into said additional laser elements producing additional circulating laser beams, said reference laser beam source directs additional parts of reference laser beams into said additional laser elements to mix with said additional circulating laser beams, said amplifier and phase conjugater amplifies and phase conjugates said additional parts of reference laser beams to produce additional amplified output laser beams from said additional laser elements, and said combiner combines said first amplified output laser beam, said second amplified output laser beam, and said additional amplified output laser beams into said powerful laser beam.

28. The system for generating a powerful laser beam of claim 25, including an amplifier for amplifying at least one of said first part of a reference laser beam or said first amplified output laser beam.

29. The system for generating a powerful laser beam of claim 28, wherein said amplifier comprises a first material and said laser element comprises a second material.

30. The system for generating a powerful laser beam of claim 29, wherein said first material and said second material are the same materials.

31. The system for generating a powerful laser beam of claim 29 wherein said first material and said second material are different materials.

32. The system for generating a powerful laser beam of claim 29 wherein said first material and said second material are different materials and each have laser linewidths such that the said laser linewidths of the two materials are sufficiently broad to sustain laser-spectral-line offsets relative to each other.

33. The system for generating a powerful laser beam of claim 29 wherein said first material and said second material are different materials and each have spectral line centroids and the laser material are sufficiently close that they the amplifier increases the intensity of the outgoing wave of the laser element as desired.

34. The system for generating a powerful laser beam of claim 25, wherein said first part of a reference laser beam is offset in frequency from said first amplified output laser beam so that said first amplified output laser beam passes through an angular dispersing element and misses said combiner.

35. A method of generating a powerful laser beam, comprising the steps of:

providing a first laser element, providing at least one additional laser element, injecting a first injection laser signal into said first laser element, injecting at least one additional injection laser signal into said at least one additional laser element, injecting a first part of a reference laser beam into said first laser element, injecting at least one additional part of a reference laser beam into said at least one additional laser element, amplifying and phase conjugating said first part of a reference laser beam and said at least one additional part of a reference laser beam thereby producing a first amplified output laser beam emanating from said first laser element and an additional amplified output laser beam emanating from said at least one additional laser element, and combining said first amplified output laser beam and said additional amplified output laser beam into said powerful laser beam.

36. The method of generating a powerful laser beam, of claim 35, comprising the step of adding a dispersion element in the output beams, and wherein the frequency of said first part of a reference laser beam is different than the frequency of said first injection laser signal which causes said first amplified output laser beam to travel through an angular dispersing element and then travel a different direction than said first input reference laser beam.

37. The method of generating a powerful laser beam, of claim 35, wherein said step of providing said laser element and said second laser element comprise providing a first diode laser element and providing at least one additional diode laser element.

38. The method of generating a powerful laser beam, of claim 35, wherein said step of injecting a first injection laser signal into said first laser element produces a first circulating laser beam in said first laser element, said step of injecting at least one additional injection laser signal into said at least one additional laser element produces at least one additional circulating laser beam in said at least one additional laser element, said step of injecting a first part of a reference laser beam into said first laser element mixes said first part of a reference laser beam with said first circulating laser beam, and said step of injecting at least one additional part of a reference laser beam into said at least one additional laser element mixes at least one additional part of a reference laser beam with said at least one additional circulating laser beam.

39. The method of generating a powerful laser beam, of claim 35, wherein said step of amplifying and phase conjugating said first part of a reference laser beam and said at least one additional part of a reference laser beam utilizes two materials, a lasing material and a phase conjugating material.

40. The method of generating a powerful laser beam, of claim 35, wherein said first laser element and said second laser element have sides, and wherein said first part of a reference laser beam and said second part of a reference laser beam enter said first laser element and said second laser element from said sides in said steps of injecting a first reference laser beam into said first laser element and injecting at least one additional part of a reference laser beam into said into said at least one additional laser element.

41. The method of generating a powerful laser beam, of claim 35, wherein said first laser element and said second laser element have sides, and wherein said first amplified output laser beam and said second amplified output laser beam exit said first laser element and said second laser element from said sides in said steps of amplifying and phase conjugating said first part of a reference laser beam and said at least one additional part of a reference laser beam.

42. The method of generating a powerful laser beam, of claim 41, including angular dispersive elements operatively connected to said sides that deflect said first amplified output laser beam and said second amplified output laser beam as they exit said first laser element and said second laser element from said sides.

\* \* \* \* \*